(12) United States Patent
Unno et al.

(10) Patent No.: US 7,053,526 B2
(45) Date of Patent: May 30, 2006

(54) PIEZOELECTRIC STRUCTURE, LIQUID EJECTING HEAD AND MANUFACTURING METHOD THEREFOR

(75) Inventors: Akira Unno, Kamakura (JP); Takao Yonehara, Atsugi (JP); Tetsuro Fukui, Yokohama (JP); Takanori Matsuda, Yokohama (JP); Kiyotaka Wasa, 2-7-27 Chiyogaoka, Nara-shi, Nara-ken (JP)

(73) Assignees: Canon Kabushiki Kaisha, Tokyo (JP); Kiyotaka Wasa, Nara (JP)

( * ) Notice: Subject to any disclaimer, the term of this patent is extended or adjusted under 35 U.S.C. 154(b) by 49 days.

(21) Appl. No.: 10/071,095

(22) Filed: Feb. 11, 2002

(65) Prior Publication Data

US 2002/0140320 A1    Oct. 3, 2002

(30) Foreign Application Priority Data

Feb. 9, 2001    (JP)    ............................ 2001-033823

(51) Int. Cl.
*H01L 41/08*    (2006.01)

(52) U.S. Cl. ....................................... 310/324; 310/331

(58) Field of Classification Search ................ 310/328, 310/330–332, 324; 347/68–72; 417/413.2
See application file for complete search history.

(56) References Cited

U.S. PATENT DOCUMENTS

| | | | | |
|---|---|---|---|---|
| 4,631,436 A | * | 12/1986 | Edinger et al. | ............ 310/332 |
| 4,783,821 A | * | 11/1988 | Muller et al. | ............... 381/173 |
| 5,160,870 A | * | 11/1992 | Carson et al. | .............. 310/339 |
| 5,719,607 A | | 2/1998 | Hasegawa et al. | ............. 347/70 |
| 5,804,907 A | | 9/1998 | Park et al. | ................... 310/358 |
| 5,984,458 A | * | 11/1999 | Murai | ......................... 347/68 |
| 6,347,862 B1 | | 2/2002 | Kanno et al. | .................. 347/68 |
| 6,639,340 B1 | * | 10/2003 | Qiu et al. | .................... 310/358 |

FOREIGN PATENT DOCUMENTS

| | | |
|---|---|---|
| EP | 0 799 700 A2 | 10/1997 |
| EP | 0 993 953 A2 | 4/2000 |
| EP | 1 038 675 A2 | 9/2000 |
| GB | 2 339 724 A | 2/2000 |
| JP | 8112896 | 5/1996 |
| JP | 10-044406 | 2/1998 |
| JP | 10-286953 | 10/1998 |
| JP | 11348285 | 12/1999 |
| JP | 2000-37877 | 2/2000 |
| KR | 2000-0016488 | 3/2000 |
| KR | 20000016488 | 3/2000 |
| WO | WO 98/46429 | 10/1998 |

* cited by examiner

*Primary Examiner*—Mark Budd
(74) *Attorney, Agent, or Firm*—Fitzpatrick, Cella, Harper & Scinto

(57) ABSTRACT

A piezoelectric structure includes a vibrational plate; a piezoelectric film; the vibrational plate including a layer of a monocrystal material, a polycrystal material, a monocrystal material doped with an element which is different from an element constituting the monocrystal material, or a polycrystal material doped with an element which is different from an element constituting the polycrystal materials, and oxide layers sandwiching the aforementioned layer, the piezoelectric film has a single orientation crystal or monocrystal structure.

8 Claims, 3 Drawing Sheets

PIEZOELECTRIC STRUCTURE, LIQUID EJECTING HEAD AND MANUFACTURING METHOD THEREFOR

BACKGROUND OF THE INVENTION

Field of the Invention

The present invention relates to a piezoelectric structure, a liquid ejecting head and a manufacturing method therefor.

Recently, printers using liquid ejection recording devices are widely used as printing apparatuses for personal computers or like, because of the high quality printing properties, easy manipulation, low cost or the like. The liquid ejection recording devices are of a type in which a bubble is generated in liquid such as ink by thermal energy, and the droplet is ejected by the resulting pressure wave, a type in which the droplet is suctioned and discharged by electrostatic force, a type in which a pressure wave is produced by a vibration element such as a piezoelectric element, or the like.

In a liquid ejecting apparatus using a piezoelectric element, there are provided a pressure chamber in fluid communication with a liquid supply chamber, a liquid ejection outlet in fluid communication with the pressure chamber, and a vibrational plate of a piezoelectric element connected to the pressure chamber. With such a structure, a predetermined voltage is applied to the piezoelectric element to collapse and expand the piezoelectric element, thus producing a vibration. This compresses the liquid in the pressure chamber and ejects the droplet through the liquid ejection outlet. Recently, a liquid ejecting apparatus is widely used, and improvements in the printing properties, particularly, high resolution, high speed printing, and/or long size liquid ejecting head are desired. To meet such demands, high resolution and high speed liquid ejecting heads have been attempted, using a multi-nozzle head structure having a high density of nozzles. In order to increase the density, it is required to downsize the piezoelectric element used for ejecting the liquid. It is desirable that manufacturing is completed by a semiconductor film formation process, from the point of view of low cost with high precision, particularly in the case of the long liquid ejecting head.

However, the piezoelectric film is manufactured by forming PbO, $ZrO_2$ and $TiO_2$ powder into a sheet, and then baking it, and therefore, it is difficult to produce a thin piezoelectric film such as not more than 10 μm. Because of this, fine processing of the piezoelectric film is difficult, and this makes the downsizing of the piezoelectric element difficult. In the case that piezoelectric film is produced by baking the powder, the influence of the grain boundary of the crystalline structure is not negligible, and therefore, a good piezoelectric property cannot be provided. As a result, the piezoelectric film produced by baking the powder does not exhibit satisfactory piezoelectric property for ejecting the liquid such as ink in a thickness not more than 10 μm. For this reason, a small size liquid ejecting head having the necessary properties for liquid ejection has not been achieved.

The powder sheet is simultaneously baked on a vibrational plate and/or a structural member of ceramic or the like. With this, when a high density ceramic is intended, the dimension change due to contraction of the materials is not negligible. This places a limit on the size, and it is difficult to arrange a great number of liquid ejection outlets (nozzles).

Japanese Laid-open Patent Application Hei 11-348285 proposes a structure and a manufacturing method for a liquid ejecting head using micro fabrication by a semiconductor process employing a sputtering method. In this publication, an orientational film formation of platinum is effected on a monocrystal MgO layer, and a layer of perovskite not comprising a Zr layer and a PZT layer are laminated.

However, with the system, there arise the following problems:

(1) the single orientation crystal or monocrystal PZT is not stably produced with high reproducibility:

(2) the oriented PZT layer can be provided only on a monocrystal substrate of monocrystal MgO or the like, which is expensive, and therefore, the process is very expensive. In addition, there is a limit to the size of the monocrystal substrate of MgO, and therefore it is not possible to produce a substrate having large area.

(3) Using the method disclosed in this publication, a connection, by adhesive material or the like, occurs in the neighborhood of the piezoelectric member or the connecting portion between the piezoelectric member and the member constituting the pressure chamber (liquid chamber). In the micromachined region, reliability against the repetition of stresses or the like is not sufficient.

(4) The vibrational plate in the method disclosed in the application, is in direct contact with liquid such as ink in the liquid ejecting head, and in addition, in the manufacturing process, it is in contact with acid, alkali or another chemical agent, and therefore, it is not possible to produce reliable liquid ejection elements. Moreover, the manufacturing process is complicated, and the liquid ejecting heads are expensive.

SUMMARY OF THE INVENTION

Accordingly, it is a principal object of the present invention to provide a liquid ejecting head and a manufacturing method therefor, wherein a piezoelectric film, vibrational plate or the like constituting the piezoelectric element are made as thin films, by which microfabrication ordinarily used in the semiconductor process is usable, and a piezoelectric structure having a high durability and high piezoelectric property with a long head size and high density of liquid ejection outlets.

According to an aspect of the present invention, there is provided a piezoelectric structure comprising: a vibrational plate and a piezoelectric film, the vibrational plate including a layer of a monocrystal material, a polycrystal material, a monocrystal material doped with an element which is different from an element constituting the monocrystal material, or a polycrystal material doped with an element which is different from an element constituting the polycrystal materials, and the vibrational plate being sandwiched by oxide layers, and the piezoelectric film having a single orientation crystal or monocrystal structure.

According to another aspect of the present invention, there is provided a manufacturing method for manufacturing a piezoelectric structure having a vibrational plate and a piezoelectric film, the method comprising: a step of forming a second oxide layer on a silicon substrate, the silicon substrate having a monocrystal silicon layer on a silicon layer with an oxide layer interposed therebetween; a step of forming a piezoelectric film of a single orientation crystal or monocrystal structure on the second oxide layer; and a step of forming an upper electrode on the piezoelectric film.

According to a further aspect of the present invention, there is provided a liquid ejecting head comprising a liquid ejection outlet; a main assembly substrate portion having a pressure chamber in fluid communication with the liquid ejection outlet and having an opening; a piezoelectric structure connected so as to plug the opening; the piezoelectric structure including a vibrational plate and a piezoelectric film, the vibrational plate including a layer of a monocrystal material, a polycrystal material, a monocrystal material doped with an element which is different from an element constituting the monocrystal material, or a polycrystal material doped with an element which is different from an element constituting the polycrystal materials, and the vibrational plate being sandwiched between oxide layers, and the piezoelectric film having a single orientation crystal or monocrystal structure.

According to a further aspect of the present invention, there is provided a manufacturing method for a liquid ejecting head including a liquid ejection outlet; a main assembly substrate portion having a pressure chamber in fluid communication with the liquid ejection outlet and having an opening; a piezoelectric structure connected so as to plug the opening, the manufacturing method comprising: a step of forming a second oxide layer on a silicon substrate, the silicon substrate having a monocrystal silicon layer on a silicon layer with an oxide layer interposed therebetween; and a step of forming a piezoelectric film of a single orientation crystal or monocrystal structure on the second oxide layer.

According to the present invention, the vibrational plate constituting the piezoelectric structure and having a monocrystal or polycrystal structure is sandwiched by oxide materials, so that even if fine cracks are produced as a result of repetition of mechanical displacement, the strength of the vibrational plate per se is maintained, and the adhesiveness to the piezoelectric film is not deteriorated, and therefore, durable devices can be provided.

In addition, a piezoelectric film of single orientation crystal or monocrystal having a high piezoelectric constant can be formed on the silicon substrate, and therefore, a film having a uniform crystal orientation can be sequentially formed on the substrate, so that a piezoelectric structure having a high frequency property, durability and electrostrictive/piezoelectric property, can be produced.

By incorporating such a piezoelectric structure, a device having a high durability, high density, large ejection power with high frequency, in which the performance of each of the liquid ejection outlets is uniform, can be provided. In addition, by producing the piezoelectric member and the vibrational plate or the like as thin films, microfabrication techniques usable in the semiconductor process are available. In addition, a liquid ejecting head having a high curability, electrostrictive/piezoelectric property, a large length, and a stabilized reliability, can be provided.

DESCRIPTION OF THE PREFERRED EMBODIMENTS

The description will be made as to the preferred embodiment of the present invention in conjunction with the accompanying drawings.

Figure 1:
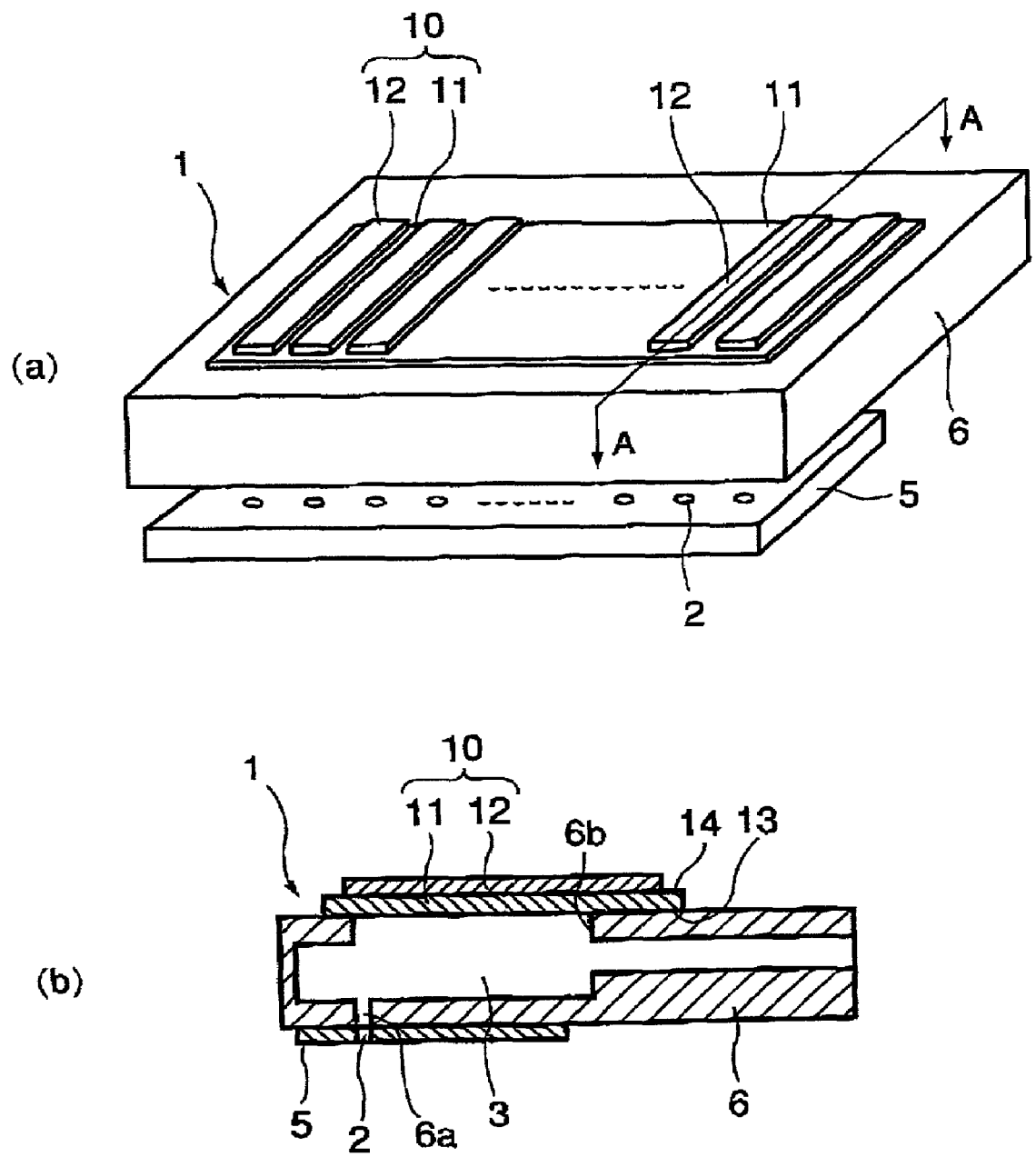
FIG. 1(a) is a perspective view of a liquid ejecting head according to an embodiment of the present invention.
FIG. 1(b) is a sectional view thereof taken on the line A—A.
Figure 2:
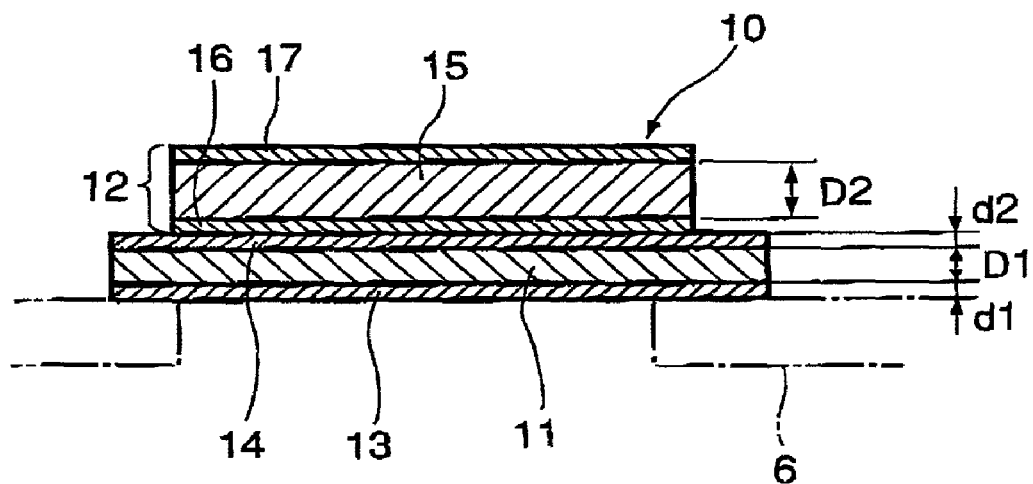
FIG. 2 is a partially sectional view of a piezoelectric structure usable for a liquid ejecting head according to the embodiment of the present invention.

FIG. 1(a) is a perspective view of a liquid ejecting head according to an embodiment of the present invention, and FIG. 1(b) is a sectional view taken along a line A—A in (a). FIG. 2 is a partially sectional view of a piezoelectric structure usable for a liquid ejecting head according to the embodiment of the present invention.

As shown in FIGS. 1(a) and (b), the liquid ejection recording head 1 in this embodiment comprises a plurality of liquid ejection outlets (nozzles) 2, a plurality of pressure chambers (liquid chambers) 3, and a piezoelectric structure 10 provided for each of the pressure chambers 3. The liquid ejection outlets 2 are formed in the orifice plate 5 at predetermined intervals. The pressure chambers 3 are formed in the main assembly substrate portion (liquid chamber substrate) 6, corresponding to the liquid ejection outlets 2. The pressure chambers 3 are connected to the respective liquid ejection outlets 2 through the liquid flow paths 6a. In this embodiment, the liquid ejection outlets 2 are provided on the bottom side, but they may be provided on the lateral side. On the top side of the main assembly substrate portion 6, an opening 6b is formed corresponding to each of the pressure chambers 3, and the piezoelectric structures 10 are positioned so as to plug the respective openings 6b on the top side of the main assembly substrate portion 6. The piezoelectric structure 10 comprises a vibrational plate 11 and a piezoelectric element 12.

The vibrational plate 11 constituting the piezoelectric structure 10 of this embodiment, as shown in FIG. 2, comprises a monocrystal material or polycrystal material, and is sandwiched by a first oxide layer 13 and a second oxide layer 14. The piezoelectric film 15 of the piezoelectric element 12 constituting the piezoelectric structure 10 is made of a single orientation crystal or monocrystal material. On the top and bottom sides thereof, there are formed electrodes 16, 17 of Au, Pt, or the like. The piezoelectric element 12 is constituted by the piezoelectric film 15 and the electrodes 16, 17.

By constituting the piezoelectric structure 10 in this manner, the vibrational plate 11 of the monocrystal polycrystal structure is sandwiched by the oxides 13, 14, and therefore, despite repeated mechanical displacements which may result in fine cracks, the vibrational plate per se is not damaged, and its adhesiveness to the piezoelectric film is not deteriorated. Thus, the durability is high.

As to the vibrational plate 11, and the first oxide layer 13 at the side remote from the piezoelectric film 15 and the second oxide layer 14 at the piezoelectric film 15 side, with the vibrational plate 11 interposed therebetween, the film thicknesses are selected so as to satisfy $d1+d2 \leq D1$, where D1 is a film thickness of the vibrational plate 11, d1 is a film thickness of the first oxide layer 13, and d2 is a film thickness of the second oxide layer 14. When this is satisfied, the durability is further improved in the piezoelectric structure (10) and the liquid ejecting head (1).

More specifically, the film thicknesses of the vibrational plate 11 (film thickness D1), the first oxide layer 13 (film thickness d1), second oxide layer 14 (film thickness d2) are as follows. The film thickness d1=5 nm-5 μm, preferably 10 nm-3 μm. The film thickness d2 is 5 nm-3 μm, preferably 10 nm-1 μm. Film thickness D1 is 100 nm-10 μm, preferably 500 nm-5 μm. If the film thickness D1 of the vibrational plate 11 exceeds 10 μm, the degree of displacement becomes insufficient for a liquid ejecting head, and therefore, it is not preferable for the high density nozzle arrangement.

In this embodiment of the piezoelectric structure, d1+d2+D1≦5×D2 is preferably satisfied, where D2 is a film thickness of the piezoelectric film 15. When d1+d2+D1≦5×D2 is satisfied, the degree of displacement in the piezoelectric structure is large enough. The specific film thickness D2 of the piezoelectric film 15 is 500 nm-10 μm, preferably 1 μm–5 μm.

The material of the vibrational plate 11 is Si, preferably monocrystal Si. The vibrational plate 11 may be doped with an element such as B. The grating constant of the Si used for vibrational plate 11 may be used to provide the piezoelectric film 15 of single orientation crystal or monocrystal.

The material of the first oxide layer 13 may be $SiO_2$, YSZ, (yttrium-stabilized zirconia), MgO or the like, and the material of the second oxide layer 14 may be at least one of $SiO_2$, YSZ, $Al_2O_3$, $LaAlO_3$, $Ir_2O_3$, MgO, $SRO(SrRuO_3)$ $STO(SrTiO_3)$ or the like. When use is made of an oxide other than $SiO_2$, the material should have a crystal orientation of (111) or (100). When the oxide layer is a combination of $SiO_2$ and another oxide, a small amount of metal element of the other oxide may be contained to provide a preferable vibration property or the like of the vibrational plate. The content of the metal element is preferably not more than 10 at %, and further preferably not more than 5 at %.

The material of the piezoelectric film 15 to be used for the piezoelectric structure 10 according to this embodiment may be, for example:
$PZT[Pb(Zr_xTi_{1-x})O_3]$, $PMN[Pb(Mg_xNb_{1-x})O_3]$, $PNN[Pb(Nb_xNi_{1-x})O_3]$,
$PSN[Pb(Sc_xNb_{1-x})O_3]$, $PZN[Pb(Zn_xNb_{1-x})O_3]$,
$PMN-PT\{(1-y)[Pb(Nb_{1-x})O_3]-y[PbTiO_3]\}$,
$PSN-PT\{(1-y)[Pb\{Sc_xNb_{1-x}\}O_3]-y[PbTiO_3]\}$, or
$PZN-PT\{(1-y)[Pb(Zn_xNb_{1-x})O_3]-y[PbTiO_3]\}$. Here, x and y are not more than 1 and not less than 0. For example, in the case of PMN, x is preferably 0.2–0.5; and in the case of PSN, x is preferably 0.4–0.7; in the case of PSN, x is preferably 0.4–0.7; in the case of PMN-PT, y is preferably 0.2–0.4; in the case of PSN-PT, y is preferably 0.35–0.5; and in the case of PZN-PT, y is preferably 0.03–0.35.

In this embodiment, these materials can be formed into a single orientation crystal or monocrystal film, and therefore, the performance is high. For example, as a method of providing a piezoelectric film having a monocrystal structure through a sputtering film formation method, a rapid cooling from the film formation temperature at a rate of not less than 30° C./min may be employed. Other methods are also usable.

The piezoelectric film may have a further structure of a single composition, or may be a laminated structure of two or more compositions. For the pulse of crystalline structure control, the film formation may be carried out after film formation of the anchoring layer of different material compositions. For example, in the case of monocrystal film formation of PZT, a Zr component tends to enter at the initial stage, and therefore, the film formation thereof is preferably carried out after the film formation of the anchoring layer of $PbTiO_3$. It may be a composition doped with a small amount of element in the main component. The single orientation crystal or the monocrystal has a priority orientation degrees of the film of not less than 80%, preferably not less than 85%, and further preferably not less than 95%, as determined by XRD (X-ray diffraction apparatus) (θ-2θ (out of plane) measurement).

An example in which the monocrystal piezoelectric film of PMN-PT or PZN-PT is used as a piezoelectric element is disclosed in U.S. Pat. No. 5,804,907, in which a bulk of crystal member produced through TSSG method (Top Speeded Solution Growth method) is cut and then is connected to the substrate (vibrational plate). This method is not suitable for a micro fabrication, and it is not possible to provide a film thickness of the piezoelectric film not more than 10 μm. In addition, it is necessary to cut along the orientation of the crystal in the bulk, which is cumbersome and time-consuming, and there is a probability of erroneous alignment with the crystal orientation.

According to this embodiment, a film having a sequentially aligned crystal orientation can be formed on the substrate, and therefore, such problems do not arise. In the case of the liquid ejecting head, the variation in the ejection performance is small, and the connection strength is high. In addition, the film is a piezoelectric film of single orientation crystal or monocrystal, and therefore, the durability and the piezoelectric property are preferable.

Specific layer structures of the piezoelectric structure according to this embodiment will be described. The display of the layer structure is "upper electrode 17// piezoelectric film 15// lower electrode 16// second oxide layer 14// vibrational plate 11// first oxide layer 13" (reference numerals are as shown in FIG. 2).

EXAMPLE 1

Pt//PZT(001)/PT(001)//Pt(100)//MgO(100)//Si(100)//$SiO_2$

The vibrational plate with this layer structure is Si(100), and the oxide layers sandwiching the vibrational plate are MgO(100) and $SiO_2$. The following are other examples:

EXAMPLE 2

Au//PZT(001)/PT(001)//PT(100)//YSZ(111)/$SiO_2$//Si(111)//$SiO_2$

EXAMPLE 3

Au//PZT(111)/PT(111)//PT(111)//YSZ(100)/$SiO_2$//Si(100)//$SiO_2$

EXAMPLE 4

Pt//PZT(111)/PT(111)//Pt(111)//YSZ(100)/Zr//Si(100)//$SiO_2$

EXAMPLE 5

Pt//PZT(111)/PT(111)//Pt(111)//MgO(111)//Si(100)//$SiO_2$

EXAMPLE 6

Au//PZT(001)//SRO(001)//Si(100)//$SiO_2$

EXAMPLE 7

Al//PZT(111)//SRO(111)//Si(111)//$SiO_2$

EXAMPLE 8

Au//PZT(111)/PT(111)//Pt(111)//YSZ(100)/$SiO_2$// Si(100)//YSZ(100)

EXAMPLE 9

Pt//PZT(001)//SRO(001)//Si(100)//YSZ(100)

EXAMPLE 10

Au//PZT(001)/PT(001)//Pt(100)//MgO(100)//Si(100)// YSZ(100)

EXAMPLE 11

Pt//PZT(001)/PT(001)//Pt(100)//MgO(100)//Si(100)// YSZ(100)

EXAMPLE 12

Pt//PZT(001)/PT(001)//Pt(100)//Al$_2$O$_3$(100)//Si(100)// SiO$_2$

EXAMPLE 13

Ag//PZT(001)/PT(001)//Pt(100)//LaAlO$_3$(100)//Si(100)// SiO$_2$

In examples 6, 7 and 9, SRO has a director conductivity, and it also functions as both the second oxide layer 14 and the lower electrode 16. In the foregoing examples, the piezoelectric film is of a laminated structure of PZT for PZT/PT. The structure may be replaced with the layer structure of PMN, PZN, PSN, PNN, PMN-PT, PSN-PT, PZN-PT.

For example, the following are usable alternatives:
Au//PMN(001)//Pt(100)//MgO(100)//Si(100)//SiO$_2$;
Pt//PMN-PT(001)//Pt(100)//MgO(100)/SiO$_2$//Si(100)// SiO$_2$;
Al//PMN-PT(001)/PT(001)//Pt(100)//YSZ(111)/SiO$_2$//Si (111)//SiO$_2$ The crystal orientations indicated in the parentheses in the layer structure indicate the crystal orientation having priority orientation not less than 80%, preferably not less than 85%, further preferably not less than 95%, as described hereinbefore.

As for the second oxide layer 14, the SiO$_2$ which is a Si oxide film or another oxide (YSZ, MgO, Ir$_2$O$_3$) may be selected depending on the manufacturing process. For example, it is possible to suppress production of SiO$_2$ by forming a YSZ film using the metal target during the film formation of the YSZ. By thin film formation of metal such as Zr or the like on the Si layer, the production of SiO$_2$ can be prevented.

The description will be made as to the manufacturing method of the piezoelectric structure and the liquid ejecting head according to the embodiment of the present invention.

The manufacturing method for the piezoelectric structure having the vibrational plate and the piezoelectric film according to this embodiment comprises a step (1) of forming a second oxide layer on a silicon substrate having a monocrystal silicon layer on a silicon layer with an oxide layer interposed therebetween; a step (2) of forming a piezoelectric film of a single orientation crystal or monocrystal structure on the second oxide layer; and a step (3) of forming an upper electrode on the piezoelectric film.

Another manufacturing method for a liquid ejecting head including a liquid ejection outlet; a main body substrate portion having a pressure chamber in fluid communication with said liquid ejection outlet and having an opening; and a piezoelectric structure connected so as to plug the opening, according to the present invention comprises, in addition to the steps (1)–(3), a step (4) of separating the piezoelectric film into a plurality of portions; a step (5) of forming said pressure chamber; and a step (6) of forming said liquid ejection outlet.

Each of these steps will be described. In the step (1) the silicon substrate having the monocrystal silicon layer above the silicon layer with the oxide layer therebetween may be SOI (silicon-on-insulator) substrate, or a film of monocrystal oxide may be formed on the silicon substrate, and a film of monocrystal silicon layer may be formed thereon. In the case of SOI substrate, the oxide layer on the silicon layer is SiO$_2$, for example, and the monocrystal oxide is YSZ(100), YSZ (111), MgO(100), MgO(111), STO(100), STO(111) or the like, for example. The film thickness (d1) of the oxide layer is 5 nm-5 μm, preferably 10 nm-3 μm. These oxide layers are usable as an etching stop layer in the step (5) of forming a pressure chamber.

The second oxide layer formed on the monocrystal silicon is preferably formed prior to the step (2) and/or step (3). The second oxide layer may be SiO$_2$, YSZ(100), YSZ(111), SRO(001), SRO(111), MgO(100), MgO(111), Ir$_2$O$_3$(100), Ir2O$_3$(111), Al2O$_3$(100), Al2O$_3$(111), LaAlO$_3$(100), LaAlO$_3$(111), STO(100), STO(111) or the like, for example. The film thicknesses (d2) of them, are 5 nm-3 μm, preferably 10 nm-1 μm.

In the above-described layer structure, the second oxide layer is MgO in example 1, and YSZ and SiO$_2$ in example 2. The SiO$_2$ may be produced by oxidative reaction during YSZ film formation which is a buffering film, or may be produced by heat treatment after the film formation. When the second oxide layer contains SiO$_2$, it is preferable that a small amount of the medal of another oxide layer (buffering film) is contained in the SiO$_2$, and the method therefor is preferably a sputtering method using an oxide target as the film formation method for the other oxide layer. The film thickness of SiO$_2$ layer can be controlled by selecting the temperature lowering process from the maximum temperature of the formed YSZ film, a temperature maintaining duration thereof, a re-heat-treatment condition and a temperature maintaining duration thereof. For example, the film thickness of the SiO$_2$ layer can be increased by the sputtering film formation temperature being maintained in a water vapor atmosphere. The production of the SiO$_2$ layer at the interface between the YSZ and the Si may be prevented by first forming a metal layer using the metal Zr target and then forming a film of YSZ. It can be selected depending on the material and the performance whether the SiO$_2$ layer is to be formed or not.

In the step (2), a piezoelectric film having a single layer structure or a laminated structure is formed, using any of compositions such as PZT, PMN, PZN, PSN, PNN, PMN-PT, PSN-PT, PZN-PT or the like. The piezoelectric film preferably has a single orientation crystal or monocrystal structure.

The formation of the upper electrode on the piezoelectric film in the step (3) may be effected through a sputtering method, an evaporation method, an application method or the like. The electrode material may be a metal material such as Au, Pt, Cr, Al, Cu, Ir, or Ni, or an electroconductive oxide such as SRO or ITO. The upper electrode may be a solid electrode or a comb-shaped electrode on the piezoelectric film.

In the manufacturing method for the piezoelectric structure, according to the embodiment of the present invention, it is possible that a single orientation crystal or monocrystal piezoelectric film having a high piezoelectric constant can be formed on the silicon substrate, and therefore, a vibrational plate in which the connection strength and the durability are high can be produced. Thus, a piezoelectric structure having a high frequency property, durability and electrostrictive/piezoelectric property can be provided.

In the manufacturing method for the liquid ejecting head, the step of separating the piezoelectric film in step (4) is a patterning step performed upon the piezoelectric film produced by the step (2). The patterning is separated correspondingly to the liquid ejection outlets (nozzles) and the pressure chambers. The patterning method may be a wet etching type, a dry etching type, a mechanical cutting type or the like. In the case of the wet etching and dry etching types, a protecting film formation may be carried out for the protection of the silicon substrate with a resist treatment for the patterning. In addition, a resin material or the like having a low rigidity not preventing expansion and contraction of the piezoelectric film may be filled between the separated piezoelectric film.

The step (5) for forming the pressure chamber includes a process step for the silicon layer at the opposite side and/or a step of connecting a separate substrate having a formed pressure chamber portion with the silicon substrate. The process step for the silicon layer may be carried out through wet etching, dry etching, or a mechanical process (sandblast process or like). The substrate for said separate substrate having the pressure chamber portion may be a silicon substrate, a SUS substrate, a polymer material substrate or the like. The connecting method in the case of use of the silicon substrate, the SUS substrate or the like may be an anodic oxidation connection method, active metal soldering method or a method using an adhesive material. When a polymer material is used, an etching process with the use of a resist material is usable. Alternatively, a substrate preprocessed is usable. The configuration of the pressure chamber may be rectangular, circular, elliptical or the like. In addition, in the case of a side shooter, the cross-sectional configuration of the pressure chamber may be reduced toward the nozzle.

The step (6) of forming the liquid ejection outlet may include connecting an orifice plate in which the liquid ejection outlets are formed corresponding to respective pressure chamber portions, or forming the liquid ejection outlets from a resist material or the like. Alternatively, after the polymer substrate is laminated, the liquid ejection outlets may be formed corresponding to the pressure chambers by laser machining. In the case of the formation of the liquid ejection outlets using a resist material, the forming operation may be carried out simultaneously with step (5). The order of the steps (4), (5) and (6) is not limited, and the separating step of the piezoelectric film (4) may be carried out at last.

According to the manufacturing method for the liquid ejecting head in this embodiment of the present invention, similarly to the case of the above-described piezoelectric structure, the piezoelectric film has a single orientation crystal or monocrystal structure, and therefore, the resultant vibrational plate has a high connection strength and durability, and therefore, it is possible to provide a liquid ejecting head having a high density, a large ejection power and suitability for high frequency printing.

The description will be made as to specific examples.

EXAMPLE 1

Figure 3:
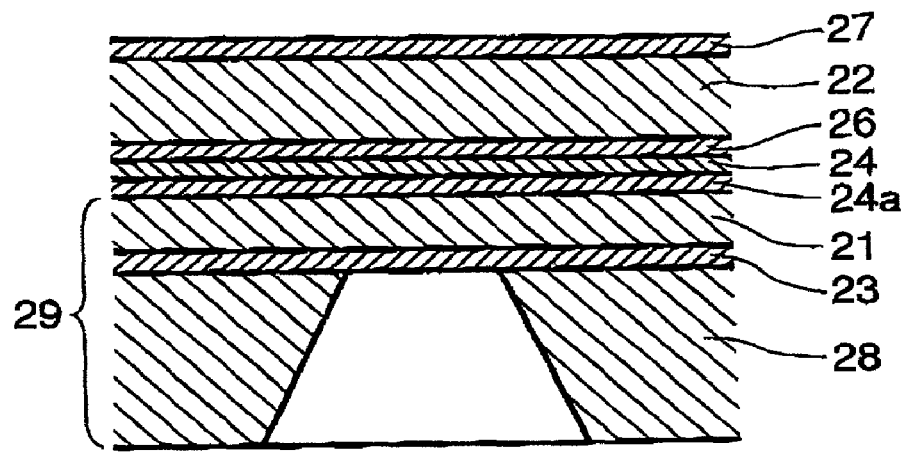
FIG. 3 is a partially sectional view of a piezoelectric structure manufactured on the basis of a manufacturing method according to an embodiment of the present invention.

Referring to FIG. 3, an example will be described. FIG. 3 is a partially sectional view of a piezoelectric structure manufactured by a method for manufacturing the piezoelectric structure according to an embodiment of the present invention. A YSZ (100) film 24 having a thickness of 0.3 μm was formed on a monocrystal Si layer 21 under 800° C. by sputtering film formation, using an SOI substrate constituted by a silicon layer 28 having a thickness of 625 μm, a $SiO_2$ layer 23 having a thickness of 0.2 μm and a monocrystal Si(100) layer 21 having a thickness of 3 μm. Thereafter, a lower electrode 26 of Pt(111) was formed into a thickness of 0.5 μm, and a piezoelectric film 22 of PT(111), PZT(111) was formed under 600° C. The composition of PZT was $Pb(Zr_{0.53}Ti_{0.47})O_3$. The total film thickness of the piezoelectric film 22 was 3.5 μm. In all of the film formation steps, the temperature changing speed in the cooling process after the film formation was not less than 40° C./min. To control the single crystal property of the film. By the step, a 0.02 μm thick $SiO_2$ layer 24a was formed as the second oxide layer at the interface between the YSZ(100) film 24 and Si(100) layer 21. The film thickness of the $SiO_2$ layer 24a was 0.2 μm in the case that it was formed under 800° C., and then it was maintained as it is in water vapor for 100 min. The content of Y and Zr metal in the $SiO_2$ was 4.6 at %. The single crystal property of the piezoelectric film 22 had not less than 99% orientation of (111), as confirmed by XRD (X ray diffraction apparatus).

On the piezoelectric film 22, an upper electrode 27 of Au was evaporated. Thereafter, a silicon layer 28 was etched into a rectangular configuration having a width 100 μm and a length 2 mm at the first oxide layer 23 by wet etching using TMAH (trimethylammonium hydroxide).

From the piezoelectric structure (FIG. 3) manufactured in the above-described steps, the upper and lower electrodes 26, 27 were taken out, and the displacement was measured at a driving frequency of 35 kHz and a driving voltage of +5V/–5V and was 0.26 μm at the central portion. In the case of the structure having a 1.0 μm thick second oxide layer 24, the preferable displacement of 0.25 μm was measured.

A piezoelectric structure having the same structure except that piezoelectric film was a polycrystal member having an orientation property of 43% was manufactured, and the displacement was 0.04 μm. The variations were significant, and the durability was low.

EXAMPLE 2

Using a substrate in which the monocrystal Si layer has a crystal orientation (111), sputtering film formation was carried out to manufacture the structure of example 2 in the above-described layer structure. By using a crystal orientation (001) of PZT, the durability was further improved. The displacement measured after the etching process similarly to Embodiment 1, was 0.25 μm–0.28 μm which was preferable.

EXAMPLE 3

Figure 4:
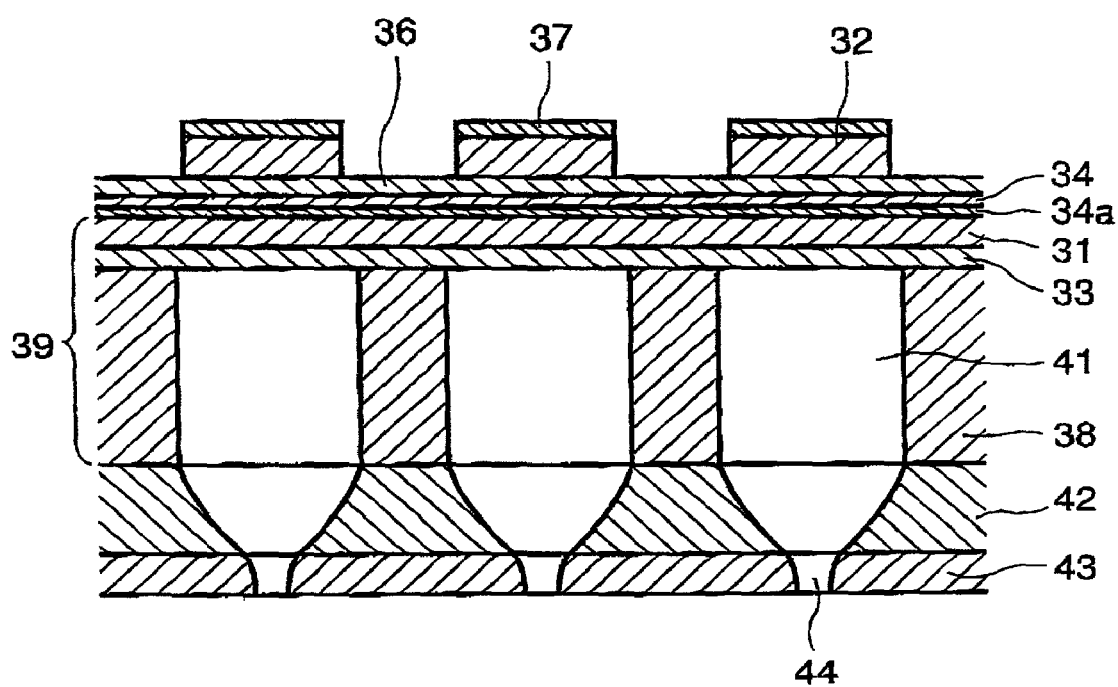
FIG. 4 is a partially sectional view of a liquid ejecting head manufactured on the basis of a manufacturing method according to an embodiment of the present invention.

Referring to FIG. 4, the description will be made as to the manufacturing method for the liquid ejecting head according to this example. FIG. 4 is a partially sectional view of a liquid ejecting head manufactured through the manufacturing method according to the embodiment of the present invention.

A MgO(100) layer 34 was formed in a thickness of 0.3 μm on a monocrystal Si(100) layer 31 having been B-doped, using a substrate 39 of a B-doped monocrystal Si(100)/$SiO_2$/Si structure (film thicknesses were 2.5 μm/1 μm/250 μm). Furthermore, a layer 0.4 μm thick of Pt(100) and a piezoelectric film 32 of PMN(001) were formed in a thickness of 2.3 μm. The composition of the PMN was adjusted by $Pb(Mg_{1/3}Nb_{2/3})O_3$. TEM observation confirmed that an $SiO_2$ layer 34a 0.05 μm thick was formed at the interface between the MgO layer 34 and the Si(100) layer 31. On the upper electrode 37, Au was pasted. The Si layer 38 was subjected to a plasma etching process using $C_4F_8$ to form the pressure chamber 41. Thereafter, the Si middle substrate 42 and the orifice plate 43 constituting the pressure chamber were connected to provide the liquid ejecting head of this embodiment.

FIG. 4 shows the liquid ejecting head manufactured by the method of this example, in which designated by 31 is a vibrational plate of B-doped monocrystal Si; 32 is a piezoelectric film of PMN; 33 is a first oxide layer; 34, 34a are a second oxide layer; 36 is a lower electrode; and 37 is an upper electrode. Designated by 38 is an Si layer in which the pressure chamber 41 is formed; 42 is a middle substrate; 43 is an orifice plate in which the liquid ejection outlets 44 are formed. The pressure chamber 41 has a width of 60 µm, a depth of 2.2 mm, and a partition width between the adjacent pressure chambers 41 of 24 µm.

Using the liquid ejecting head, ink ejection tests were carried out. A maximum ejection speed of/sec was confirmed at a driving frequency of 35 kHz with a driving voltage of +7V/−7V. The size of the droplets was controllably 3 pl–26 pl. A durability test repeating $10^9$ displacements was carried out, and the decrease in the displacement was not more than 5%.

Two liquid ejecting heads were manufactured with the same structure except for the film thickness of the monocrystal silicon layer being 10 µm and 11 µm. The displacement in the liquid ejecting head having the Si layer of 10 µm thick was smaller by 10% than the liquid ejecting head having the Si layer 2.5 µm thick, but it could eject high viscosity (10 cps) droplets. In the case of the liquid ejecting head using the 11 µm thick Si layer, the reduction in the displacement was 17%, but it could eject high viscosity droplets, similarly. However, the durability is slightly lower than the liquid ejecting head using the 10 µm thick Si layer.

EXAMPLE 4

The piezoelectric film in Embodiment 3 was modified by using a piezoelectric film of PSN-PT(001) (the other structures were the same). The composition of PSN-PT was suggested to be $0.55[Pb(Sc_{1/2}Nb_{1/2})O_3]0.45[PbTiO_3]$. The dimensions such as the width of the pressure chamber and the like were the same as in Embodiment 3. It was confirmed that ink could be ejected at a speed of 14.3 m/sec with the same driving conditions. In addition, when the width of the pressure chamber was changed to 40 µm, and the length of the pressure chamber was changed to 2.5 mm, the ink could be ejected at a speed of not less than 10 m/sec, which is practical.

EXAMPLE 5

The piezoelectric film in Embodiment 4 was changed to PZN-PT(001), without changing the other structures, and the liquid ejecting head was manufactured. The composition of PZN-PT was $0.90\{Pb(Zn_{1/3}Nb_{2/3})O_3\}0.10\{PbTiO_3\}$. The ejection speed of the ink with the width of the pressure chamber being 60 µm was 14.1 m/sec, which was preferable. The volumes of the droplets were very stable.

While the invention has been described with reference to the structures disclosed herein, it is not confined to the details set forth and this application is intended to cover such modifications or changes as may come within the purpose of the improvements or the scope of the following claims.

What is claimed is:

1. A liquid ejecting head comprising:
a main assembly substrate portion having a pressure chamber in fluid communication with a liquid ejection outlet; and
a piezoelectric structure provided for said pressure chamber,
said piezoelectric structure including:
a vibrational plate; and
a piezoelectric film,
said vibrational plate including a main layer of a monocrystal material or a main layer of a monocrystal material containing an element which is different from an element constituting the monocrystal material, and oxide layers which sandwich said main layer, and
said piezoelectric film having a single orientation crystal or monocrystal structure.

2. A liquid ejecting head according to claim 1, wherein a film thickness D1 of said vibrational plate and film thicknesses d1, d2 of said oxide layers satisfy $d1+d2 \leq D1$.

3. A liquid ejecting head according to claim 2, wherein a film thickness D2 of said piezoelectric film satisfies $d1+d2+D1 \leq 5 \times D2$.

4. A liquid ejecting head according to claim 1, wherein a composition of said piezoelectric film is one of PZT, PMN, PNN, PSN, PMN-PT, PNN-PT, PSN-PT, and PZN-PT, and said piezoelectric film has a single layer structure or a laminated structure of different compositions.

5. A liquid ejecting head according to claim 1, wherein said oxide layers comprise at least one of $SiO_2$, YSZ, $Al_2O_3$, $LaAlO_3$, $Ir_2O_3$, MgO, SRO, and STO.

6. A liquid ejecting head according to claim 1, wherein said element which is different than the element constituting the monocrystal material is Si.

7. A liquid ejecting head according to claim 6, wherein said main assembly substrate portion is made of Si, and is contacted to one of said oxide layers.

8. A liquid ejecting head according to claim 7, wherein said piezoelectric film is disposed at a side of the other of said oxide layers.

* * * * *

UNITED STATES PATENT AND TRADEMARK OFFICE
CERTIFICATE OF CORRECTION

PATENT NO. : 7,053,526 B2
APPLICATION NO. : 10/071095
DATED : May 30, 2006
INVENTOR(S) : Akira Unno et al.

It is certified that error appears in the above-identified patent and that said Letters Patent is hereby corrected as shown below:

ON THE COVER PAGE
(Item 56), REFERENCES CITED, FOREIGN PATENT DOCUMENTS
Col. 2, line 13, "8112896" should read --8-112896--.
Col. 2, line 16, "11348285" should read --11-348285--.
Col. 2, line 19, "KR 20000016488 3/2000" should be deleted.
Col. 2, line 21, insert --Korean Office Action No. 9-5-2003-050574257 with translation of pertinent portion.--

COLUMN 1
Line 13, "or like" should read --or the like--.

COLUMN 2
Line 9, "reproducibility:" should read --reproducibility.--.
Line 26, "another" should read --other--.
Line 27, "agent," should read --agents,--.

COLUMN 4
Line 5, "ment" should read --ments--.

COLUMN 5
Line 38, "and" should be deleted.
Line 39, "in the case of PSN, x is" should be deleted.
Line 40, "preferably 0.4-0.7;" should be deleted.

COLUMN 7
Line 44, "the" (first occurrence) should read --a--.

COLUMN 8
Line 31, "medal" should read --metal--.

COLUMN 9
Line 49, "at last." should read --last.--.

UNITED STATES PATENT AND TRADEMARK OFFICE
CERTIFICATE OF CORRECTION

PATENT NO.       : 7,053,526 B2
APPLICATION NO.  : 10/071095
DATED            : May 30, 2006
INVENTOR(S)      : Akira Unno et al.

It is certified that error appears in the above-identified patent and that said Letters Patent is hereby corrected as shown below:

COLUMN 10
Line 25, "width" should read --width of--.
Line 26, "length" should read --length of--.

Signed and Sealed this

Thirtieth Day of January, 2007

JON W. DUDAS
*Director of the United States Patent and Trademark Office*